United States Patent [19]

Eastman et al.

[11] Patent Number: 4,561,040
[45] Date of Patent: Dec. 24, 1985

[54] COOLING SYSTEM FOR VLSI CIRCUIT CHIPS

[75] Inventors: Dean E. Eastman, Ossining, N.Y.; Jerome M. Eldridge, Los Gatos; Kurt E. Petersen; Graham Olive, both of San Jose, all of Calif.

[73] Assignee: IBM Corporation, Yorktown Heights, N.Y.

[21] Appl. No.: 630,031

[22] Filed: Jul. 12, 1984

[51] Int. Cl.$^4$ ............................................. H05K 7/20
[52] U.S. Cl. ..................................... 361/385; 357/82; 165/80.4
[58] Field of Search ................... 165/80 C X, 83, 170; 174/15 R, 16 HS; 357/81, 82 X; 361/385 X, 386, 387, 388; 138/42

[56] References Cited

U.S. PATENT DOCUMENTS

| | | | |
|---|---|---|---|
| 3,375,855 | 4/1968 | Deeks | 138/42 |
| 3,649,738 | 3/1972 | Anderson | 174/15 R |
| 4,109,680 | 8/1978 | Lavender | 138/42 |
| 4,138,692 | 2/1979 | Meeker | 357/82 |
| 4,352,373 | 10/1982 | Kay | 138/42 |
| 4,494,171 | 1/1985 | Bland | 361/385 |

OTHER PUBLICATIONS

IBM Tech Discl Bull, vol. 20, #9, p. 3742, Feb. 1978, Anacker, Liquid Cooling of IC Chips.
IEEE El. Circ. Conf. 1982, "Ultrahigh Thermal . . . Integrated Circuits", Tuckerman, pp. 145–149.
IEEE Electron Device Letters, vol. EDL-2, No. 5 1981, "High Perf Heat-Sink for VLSI", Tuckerman.
IBM Tech Discl Bull, vol. 23, #2, Jul. 1980, p. 579, Strudwick, "Silicon Tunnel Heat Sink".

Primary Examiner—G. P. Tolin
Attorney, Agent, or Firm—John F. Ohlandt

[57] ABSTRACT

A system for cooling integrated circuit chips and particularly those involving very large scale integrated circuits; the system provides for closely associating the heat-sink or heat exchange element with the integrated circuit chip by having the heat-sink, in the form of a "cooling chip", in intimate contact with the back surface of an integrated circuit chip (in a "flip chip" configuration, the front, or circuit-implemented, surface, makes contact with a ceramic carrier or module); the cooling chip is provided with a plurality of spaced parallel grooves which extend along the one side or surface opposite the surface that is in bearing contact with the integrated circuit chip, whereby liquid coolant flows through the grooves so as to remove heat from the integrated circuit chip; further included in the system is a specially configured bellows for conducting the liquid coolant from a source to the heat-sink, and for removing the liquid coolant; a coolant distribution means, in the form of at least one glass plate or manifold, is provided with spaced passageways interconnecting the respective incoming and outgoing coolant flow paths of the bellows with the heat-sink.

17 Claims, 4 Drawing Figures

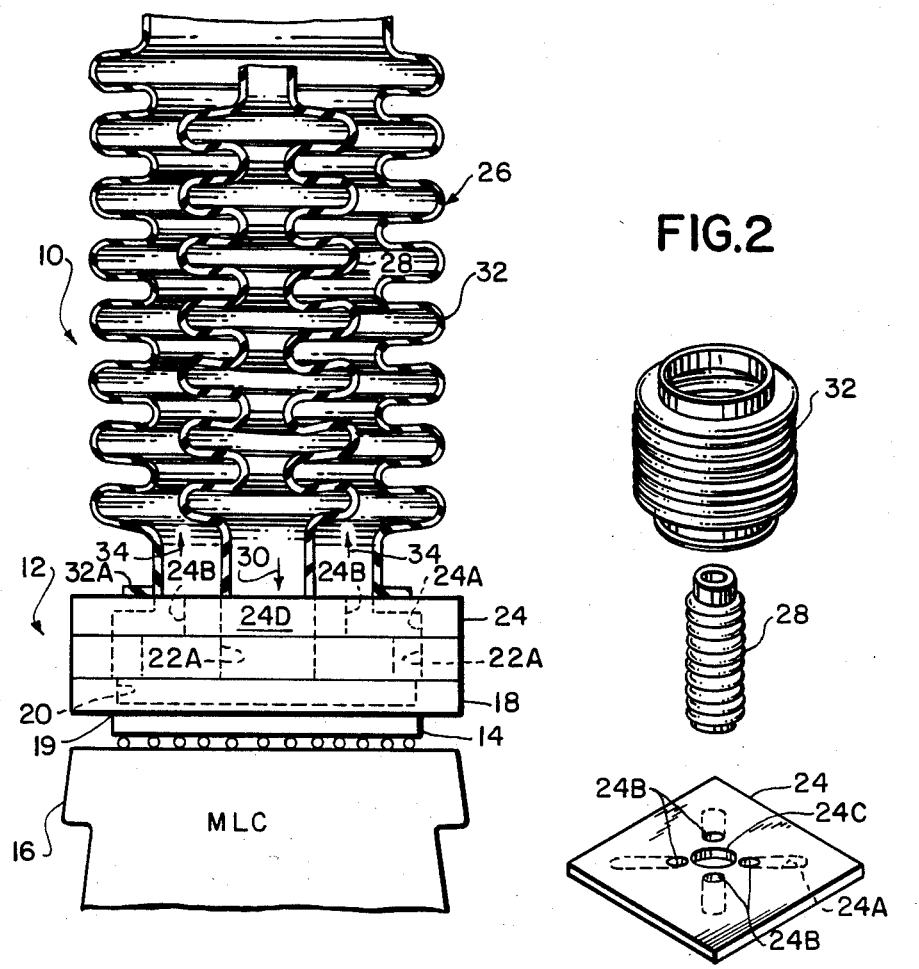
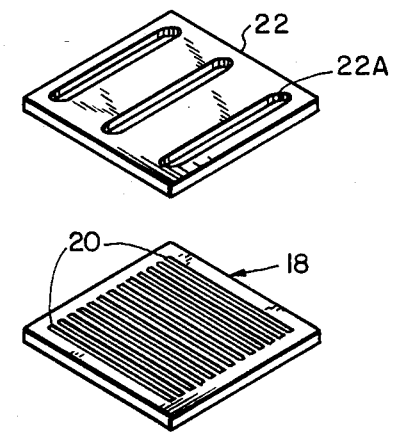
FIG.2
FIG.1

COOLING SYSTEM FOR VLSI CIRCUIT CHIPS

TECHNICAL FIELD

The present invention relates to a cooling system and particularly such a system for cooling very large scale integrated circuit chips.

BACKGROUND INFORMATION

Integrated circuit chips may be effectively cooled by using convective heat transfer to a suitable circulating liquid coolant. In the case of what is known as "C4 bonded flip chip packaging technology" which involves mounting and interconnecting typical circuit chips to a ceramic carrier by means of solder balls, a method is required whereby the liquid coolant is brought into intimate thermal contact with the silicon integrated circuit chip.

It has been recognized for some time now that liquid cooling promises to enable very compact arrangements for the cooling of arrays of very large scale integrated circuit chips, which are, of course, closely spaced to minimize propagation delays. Dense packing of these arrays rules out a system of forced air convection because of the large size of high performance forced air heat exchangers.

Accordingly, it has been proposed heretofore that, for example, heat be conducted through aluminum pistons spring-loaded onto the back of each chip, through cylinder walls surrounding the pistons, and into a heat exchanger circulating a liquid coolant. The thermal resistance of such a package allows a dissipation of about three or four watts per chip. However, even more compact confirgurations have been proposed by closely associating the heat exchanger with the silicon integrated circuit chip. Such a confirguration can be appreciated by referring to an article by W. Anacker entitled "Liquid Cooling of Integrated Circuit Chips", IBM Technical Bulletin, Vol. 20, pp. 3742–3743 of 1978.

Also, compact, high performance heat-sinking for very large scale integrated circuits has been proposed in (1) an article by Tuckerman and Pease entitled "High Performance Heat-Sinking for VLSI", IEEE Electron Device Letters, Vol. EDL-2, No. 5, 1981 and (2) an article by Tuckerman and Pease entitled "Ultrahigh Thermal Conductance Microstructure for Cooling Integrated Circuits", Proceedings, 1982 IEEE Electronic Components Conference. The first article discloses a compact heat-sink incorporated within an integrated circuit chip. This is done by forming microscopic channels for flow of the liquid coolant in the integrated circuit chip immediately adjacent the front side of the substrate where the circuitry is embedded; a cover plate overlies the back side of the chip or substrate for defining a manifold for communicating with the microscopic channels or grooves. Thus the system might be characterized as an integrated or directly cooled system. However, as pointed out in the second article cited above by Tuckerman and Pease, there are problems associated with such integration or direct cooling: it becomes necessary to construct sealed input and output manifolds ("headers") which connect the ends of the microgrooves formed in the integrated circuit chip. One approach to the construction of these manifolds involves etching them directly in the silicon wafer; a PYREX cover plate containing an input and output port is hermetically bonded onto the wafer. The difficulty here is that such an approach is wasteful of silicon space. Moreover, it requires registration between the front side (i.e. the circuit side) and the back side (i.e. the groove side) of the wafer and cannot be used if the grooves are to be machined using precision sawing rather than anisotropic etching.

Another problem that presents itself is that if one desires to use anisotropic etching of the required deep grooves, a (110)-oriented silicon wafer is then required, but this is not an acceptable orientation for integrated circuit fabrication. Moreover, one might prefer to have the flexibility of being able to machine the grooves. However, this is also not possible in the case of the (100) orientation for a silicon wafer, which orientation is suitable for circuit fabrication. In other words, such mechanical methods of machining grooves in a (100) IC chip are impractical.

A further difficulty resides in the lack at the present state of the art for economically and reliably connecting the heat sink of the present invention to the liquid coolant source by means of a bellows device. In general, cooling bellows have been known, such as those described in U.S. Pat. No. 3,649,738. However, such devices have not provided for linking with the total area of the grooved heat transfer surface of a cooling chip.

SUMMARY OF THE INVENTION

Accordingly, it is a primary object of the present invention to provide a sealed, flexible fluid delivery system which enables extremely high efficiency heat exchange operation with respect to semiconductor chips.

Another primary object is to avoid taking up valuable "real estate"; that is, space on, or associated with, integrated circuit chips for the purpose of delivering or circulating liquid coolant adjacent the integrated circuit ships.

Another object is to enable demounting of the cooling assembly at an appropriate interface without having to make any hydraulic disconnections adjacent to the integrated circuit chip in the event that chip "reworking" is required. Such reworking is sometimes required when chip defects indicate that repair or replacement is called for.

Other objects are to form a symmetrical, intimate and ideally compatible mechanical and thermal contact to the integrated circuit chip, which minimizes differential thermal expansion problems; further, to provide sufficient surface area for efficient heat transfer into the coolant.

Yet another object is to enable reliable connection of the heat-sink to the source of liquid coolant.

In fulfillment of the above stated and other objects, a primary feature of the present invention resides in an efficient cooling assembly in which the liquid coolant is conveyed adjacent to the integrated circuit chip by a heat-sink and coolant distribution means that insures optimum heat transfer into the liquid coolant. This heat-sink and distribution means takes the form, in a preferred embodiment, of a three piece heat exchanger stack comprising (1) a (110) orientation silicon heat-sink (cooling chip) intimately bonded to the integrated circuit chip; (2) a channel element preferably made of glass, in intimate contact with the upper surface of the cooling chip; and (3) an interconnection element, also preferably of glass, in intimate contact with the channel element.

The two glass elements, constituting the coolant distribution means, provide passageways conveying or distributing the liquid coolant from a specially configured metallic bellows to the heat-sink, and for returning the liquid coolant. The bellows includes a delivery flow path defined by a centrally located flexible member, and a return flow path formed by the annular space between the centrally located flexible member and an outer flexible member. The passageways are preferably created by having the channels in the channel element suitably spaced, all of them extending through the element to intersect the array of parallel grooves formed in the heat-sink (cooling chip); further, by having further channels in the interconnection element, which take the specific form of input and output ducts terminating in respective input and output ports, the ports communicating directly with the ends of the bellows.

A specific feature of the present invention resides in the particular arrangement of the channels in the glass plates noted above. These channels are so designed that the array of parallel grooves in the silicon heat-sink or cooling chip is divided into two halves hydraulically connected in parallel. Moreover the hydraulic impedance of the flow path by way of any one groove is approximately the same as through any other groove. The benefits of this arrangement are that (1) for given pressure, the flow rate and therefore the thermal conductance are increased; (2) temperature uniformity is improved across the chip. In other words, unlike previously disclosed arrangements known to the art, according to which a variable temperature or temperature profile through the chip is obtained, in the case of the present invention, a uniform temperature is established.

Another specific feature resides in the provision of coaxially mounted, flexible bellows members which provide (1) self-aligning capability so as to accommodate chip tilt; (2) low, balanced mechanical loading on the solder bonds of the integrated circuit chip, due to the small cross-sectional area of the internal bellows, that is, the high pressure member of the bellows means. Furthermore, hydraulic reliability is inherent in the fact that double bellows surround the high pressure regiom. Thus, even though the outer bellows member were to be punctured, the internal or inner bellows would maintain the high pressure incoming flow.

Other and further objects, advantages and features of the present invention will be understood by reference to the following specification in conjunction with the annexed drawing, wherein like parts have been given like numbers.

BRIEF DESCRIPTION OF THE DRAWINGS

FIG. 1 is an elevational view partly broken away illustrating the cooling assembly in accordance with a preferred embodiment of the present invention.

FIG. 2 is an exploded view of the principal components of such cooling assembly, including the heat-sink and the channel and interconnection elements, which together form a three layer stack for cooling purposes; and further showing the coaxial bellows arrangement.

DETAILED DESCRIPTION OF THE PREFERRED EMBODIMENT OF THE INVENTION

Figure 3:
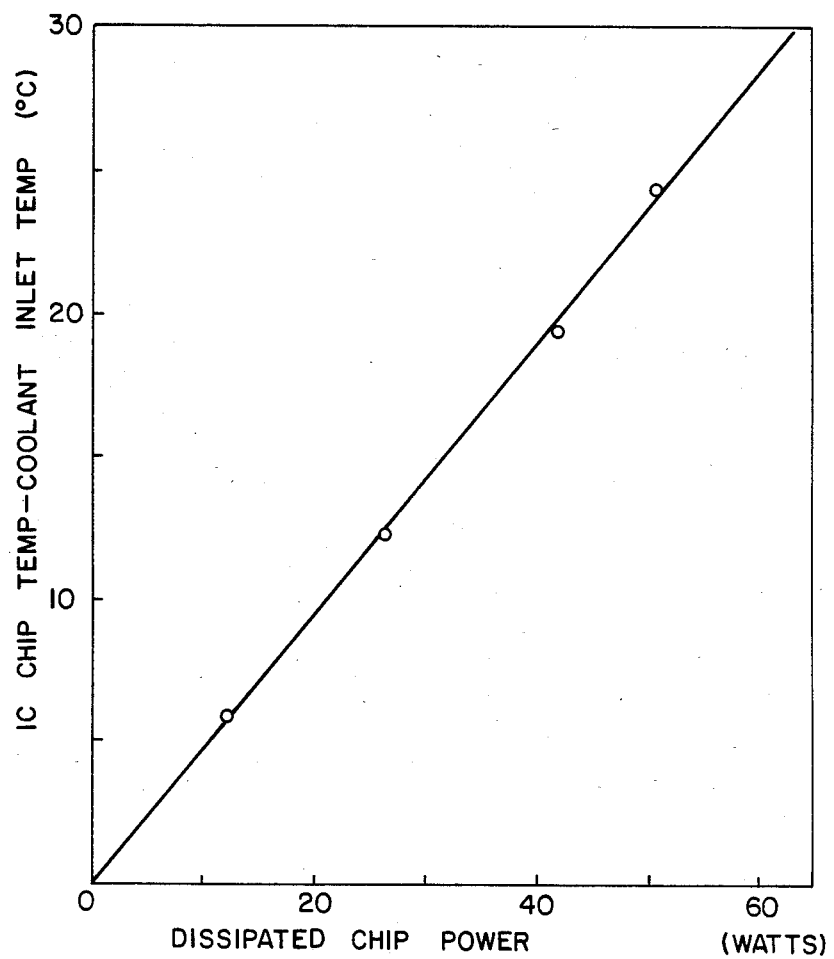
FIG. 3 is a graph depicting the relationship between temperature rise in the integrated circuit chip as a function of dissipated power for a water inlet temperature of 25° C.
Figure 4:
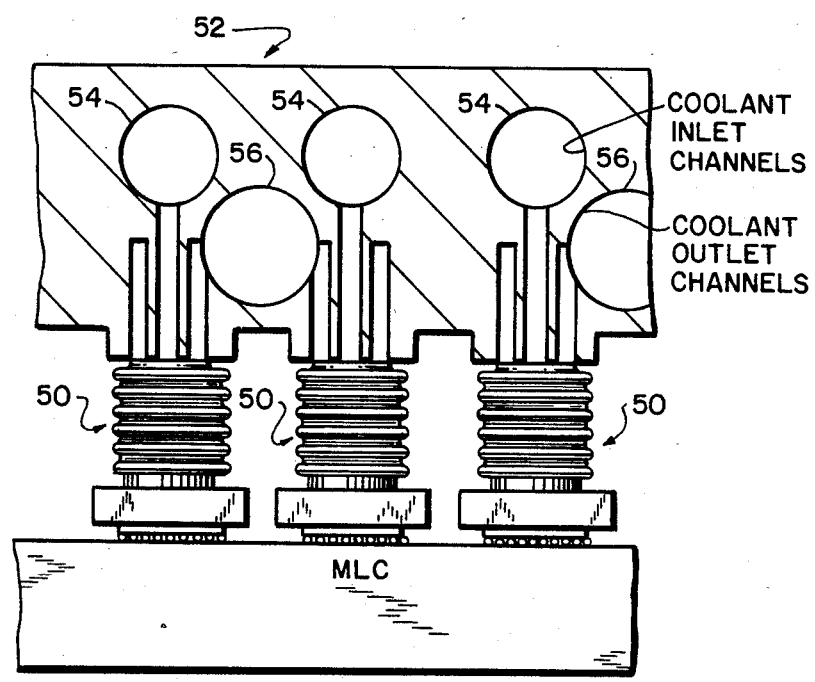
FIG. 4 illustrates a cooling assembly involving the cooling of multiple chip arrays, including individual bellows assemblies for each chip with a common coolant delivery header or cap.

Referring now to the figures of the drawings, and particularly for the moment, to FIG. 1 thereof, there will be seen in a partially fragmentary elevational view, a cooling assembly 10 in accordance with a preferred embodiment of the present invention, and featuring a stacked heat-sink and coolant distribution means 12 for the purpose of efficiently cooling an integrated circuit chip 14 of a type well known in the art and typically referred to as "flip chip packaging". The chip 14 is mounted on a ceramic module 16 and electrically connected thereto by conventional means, such as solder balls. Typically this module 16 is a multiple layer ceramic structure in which a plurality of conductors are formed for well known interconnection purposes. The chip 14 typically has dimensions of about 4.5 mm$^2$. A silicon plate or cooling chip 18 serves as the heat-sink portion of the means 12, being in intimate contact on its lower surface with the upper or "back" surface of the chip 14. The integrated circuitry is, of course, embedded adjacent the front surface of such chip.

For the purpose of ensuring that the chip can be reworked in case of any defects, the bonding arrangement consists of a demountable solder bond 19 forming the intimate contact between chip 14 and heat-sink 18.

In order to provide the requisite efficient cooling, the assembly is fabricated by etching, or otherwise machining, narrow spaced grooves 20 (about fifty micrometers wide) into the one or upper side of a (110)-oriented silicon wafer over areas similar to the integrated circuit chip size, then dicing the wafer into somewhat larger sections; that is to say, into cooling chips of slightly greater size, as seen in FIG. 1, when compared with the integrated circuit chip 14.

As will be appreciated from FIGS. 1 and 2, the grooved silicon cooling chip 18 is next joined to a first plate 22, preferably of glass, as part of the distribution means that will efficiently distribute or convey a liquid coolant to the grooves 20 of the cooling chip 18. The first glass plate 22 is in turn joined to a second glass plate 24. The glass of which the plates 22 and 24 is made, such as Corning No. 7740, is chosen to provide a thermal expansion coefficient matching that of silicon. The first bond (silicon chip 18 to glass plate 22) is achieved by field-assisted thermal bonding, and the glass-to-glass bond (plate 22 to plate 24) by a modification of the same method or by using epoxy resin adhesive.

Both of the plates 22 and 24 contain fluid passageways formed by channels and ducts cut by ultrasonic machining. In the case of plate 22, a centrally located channel 22A and two side channels 22A are provided, such channels being cut through the plate 22. In the case of plate 24, axially and radially extending ducts 24A, which are cut into the plate 24 from the lower surface, terminate in ports 24B at the upper surface. Limited areas at the outer ends of the radially extending portions of pairs of ducts 24A overlie and communicate with opposite ends of the respective side channels 22A in plate 22, as will be seen in FIG. 1. A centrally located, single inlet port 24C is also provided in the plate 24 and serves to permit communication with the incoming flow path of liquid coolant. Such inlet port 24C continues into a duct 24D, centrally located and communicating at its inner end with a centrally located portion of input channel 22A. The latter channel further communicates with the midpoints of each of the individual grooves 20 in the cooling chip or heat-sink 18. Accordingly, incoming flow of liquid coolant at the inlet port 24C flows into duct 24D, and thence along central channel 22A where its flow is split into two halves in opposite directions in grooves 20. The return flow is by way of the spaced side channels 22A situated at opposite end points of the individual grooves 20, thence into pairs of ducts 24A and corresponding pairs of ports 24B, since each of pairs of ducts 24A communicate at their respective end portions with opposite ends of respective side channels 22A.

It will be seen from FIGS. 1 and 2 that liquid coolant is conveyed to the heat-sink distribution means 12 from a source (not shown) by means of a bellows assembly or means 26. The bellows means comprises an inner bellows member 28 and the flow path within that member is indicated by the arrow 30. The outer bellows member 32 defines with the inner member 28 an annular space which establishes an outgoing flow path as indicated by the arrows 34. The outer diameter of the lower end of the inner bellows member is slightly smaller than the centrally located port 24C; whereas the inner diameter of the outer bellows member 32 is sufficient to circumscribe all of the outgoing access ports 24B such that flow from all of these is directed into the annular space and constitutes the flow path 34. The lower ends of each of the bellows members 28 and 32 are affixed or attached by suitable means such as epoxy resin adhesive, the inner bellows being attached within the port 24C, the outer bellows by means of flange 32A to the upper surface of element or plate 24.

It will be appreciated that the arrangement thus far described of the heat-sink-fluid distribution means is such that the array of silicon grooves 20 is effectively divided into two halves hydraulically connected in parallel. Moreover, the hydraulic impedance of the flow path via any one groove is approximately the same as through any other groove. Thus the benefits which accrue are as follows: for given pressure, the flow rate, and therefore the thermal conductance are increased. Beyond that, temperature uniformity is established across the chip, instead of a widely variable temperature from one portion of the chip to another, particularly since the center of the chip tends to be at a higher temperature than the periphery.

In assembling the cooling apparatus of the present invention, the bellows assembly 26 and the heat-sink-coolant distribution means 12 is assembled to the multilayer ceramic module 16 on which the integrated circuit chip 14 has already been bonded, as already described. Since the (110) silicon cooling chip 18 is larger than the integrated circuit chip and the bellows have well-defined spring constants and flexibility, the cooling assembly has sufficient built-in tolerance and self-aligning capability that the cooling chip will settle on to the integrated circuit chip. The surfaces of these two chips, 14 and 18, are very flat and will, consequently, make intimate contact.

As has been noted previously, if the bottom surface of the cooling chip 18 is coated with a thin film of low temperature solder, both chips can be soldered together after final assembly, thereby forming a demountable symmetrical silicon/solder/silicon sandwich with very little thermal mismatch. Furthermore, the cooling assembly may be subsequently demounted at this interface without making any hydraulic disconnects close to the integrated circuit chip, in the event that chip "reworking" is required.

In operation of the cooling system of the present invention, the heat dissipated in the integrated circuit chip 14 is conducted efficiently by the "fins" or ridges, which are defined between the individual grooves 20 in the cooling chip. Moreover, heat transfer into the liquid coolant is maximized because of the large available heat transfer area, which is several times the area of the integrated circuit chip itself, the narrowness of the coolant carrying grooves 20, and the rapid flow of the coolant past the silicon fins. The liquid coolant should be chosen to have a high volumetric heat capacity and low viscosity in order to provide the most efficient heat transfer from the grooved cooling chip 18.

A prototype system of the type illustrated in FIG. 1, coupled to an integrated circuit chip, has been tested with water as the coolant to power densities of 300 watts per square centimeter in the integrated circuit chip. The temperature rise in the circuit chip as a function of dissipated power for a water inlet temperature of 25° C. is shown in FIG. 2. The slope yields a total thermal resistance of 0.48° C. per watt or 0.1° C. square centimeters per watt, and the mechanical loading on the circuit chip is well within the capabilities of the solder bonds.

Referring now to FIG. 3, an arrangement is depicted according to which multiple-chip arrays may be cooled. This is done by providing an individual bellows assembly 50 for each chip involved, with a common coolant delivery header cap 52, including individual coolant inlet channels 54 and coolant outlet channels 56. Alternatively, a coaxial bellows assembly coupled to a single sufficiently large grooved silicon heat exchanger plate may be attached to all of the chips in the array. In such case, sheets of foil made up of a low melting point fusible alloy (for instance, containing combinations of the metals (Bi, Pb, Sn, Cd, In) can be interposed between the integrated circuit chips and the cooling plate. When heated to a suitable temperature, the alloy interlayers conform intimately to the adjacent surfaces and accommodate any non-planarity in the chip array, forming a good thermal demountable joint.

What has been disclosed herewith is a unique solution to the problem of efficiently cooling a very high speed integrated circuit array. The system is compatible with current technology and is extendible to future high speed applications. The invention provides a highly efficient, stacked heat-sink-coolant distribution means including a cooling chip formed to have an array of spaced parallel grooves whereby a very large surface area for heat transfer from an integrated circuit chip is provided. This heat-sink or cooling chip can be readily demounted from the integrated circuit chip. Combined with such cooling chip is a precise arrangement of a coolant distribution means such as to permit advantageous results as already described. The bellows means or assembly, by virtue of its coaxial design, enables enhanced hydraulic reliability, as well as permitting self-aligning capability to accommodate chip tilt; further, to enable low, balanced mechanical loading on solder bonds involved with the integrated circuit chip.

While there have been shown and described what are considered at present to be the preferred embodiments of the present invention, it will be appreciated by those skilled in the art that modifications of such embodiments may be made. It is therefore desired that the invention not be limited to these embodiments, and it is intended to cover in the appended claims all such modifications as fall within the true spirit and scope of the invention.

Having thus described the invention, what is claimed as new, and desired to secure by Letters Patent is:

1. A system cooling an integrated circuit chip comprising:
   (a) a heat-sink having one surface in intimate contact with the back surface of said integrated circuit chip, the front surface thereof making contact with a carrier for said integrated circuit chip;
   (b) said heat-sink including a semiconductor plate having a plurality of spaced parallel grooves, which grooves extend along the surface opposite said one surface, for conducting liquid coolant so as to remove heat from said integrated circuit chip;
   (c) a bellows including a first flexible member defining a flow path for said liquid coolant to said heat-sink; a second coaxial flexible member defining with said first member an annular flow path for said liquid coolant from said heat-sink;
   (d) a coolant distribution means having spaced passageways for interconnecting the respective flow paths of said bellows to spaced points on said grooves of said heat-sink, said coolant distribution means being in stacked relationship with said heat-sink.

2. A system as defined in claim 1 in which said coolant distribution means includes
   (1) an interconnection element;
   (2) a channel element, which has its upper surface in intimate contact with the lower surface of said interconnection element and its lower surface in intimate contact with the upper surface of said heat-sink,
   (3) said passageways being defined by spaced channels in said channel element interconnecting with corresponding ducts in said interconnection element, said ducts terminating in inlet and outlet ports.

3. A system as defined in claim 1, in which said spaced points are located at opposite ends of said grooves and at the midpoint of said grooves, whereby each groove is divided into two halves for flow of the liquid coolant in opposite directions therethrough.

4. A system as defined in claim 3, in which said midpoint is connected to the incoming flow of liquid coolant and said end points are connected to the outgoing flow of liquid coolant.

5. A system as defined in claim 4 in which all of said grooves are connected hydraulically in parallel.

6. A system as defined in claim 2, in which said spaced channels in said channel element include a centrally located channel and side channels on either side thereof, pairs of said corresponding ducts in said interconnection element having portions overlying the opposite ends of said respective side channels.

7. A system as defined in claim 6, in which a single inlet port communicates with said flow path for the liquid coolant to said heat-sink, and said outlet ports communicate with said annular flow path.

8. A system as defined in claim 7, in which a duct extends from said inlet port to communicate with the centrally located channel in said channel element.

9. A system cooling an integrated circuit chip comprising:
   (a) a heat-sink having one surface in intimate contact with a back surface of said integrated circuit chip, the front surface thereof making contact with a carrier for said integrated circuit chip;
   (b) said heat-sink including a semiconductor plate having a plurality of spaced parallel grooves, which grooves extend along the surface opposite said one surface and said grooves not extending through said heat-sink, for conducting liquid coolant so as to remove heat from said integrated circuit chip;
   (c) a coolant distribution means having spaced passageways for interconnecting oppositely directed first and second flow paths for liquid coolant to spaced points on said grooves of said heat-sink, said coolant distribution means further including
      1. an interconnection element;
      2. a channel element, which has its upper surface contacting said interconnection element and its lower surface in intimate contact with the upper surface of said heat-sink;
      3. said passageways being defined by spaced channels in said channel element interconnecting with corresponding ducts in said interconnection element, said ducts terminating in inlet and outlet ports at the upper surface of said interconnection element.

10. A system as defined in claim 9, in which said spaced points are located at opposite ends of said grooves and at the midpoint of said grooves, whereby each groove is divided into two halves for flow of the liquid coolant in opposite directions therethrough.

11. A system as defined in claim 10, in which said midpoint is connected to the incoming flow of liquid coolant and said end points are connected to the outgoing flow of liquid coolant.

12. A system as defined in claim 11, in which all of the grooves are connected hydraulically in parallel.

13. A system as defined in claim 9, in which said spaced channels in said channel element include a centrally located channel and side channels on either side thereof, pairs of said corresponding ducts in said interconnection element having portions overlying the opposite ends of said respective side channels.

14. A system as defined in claim 13, in which a single inlet port communicates with said first flow path for the liquid coolant to said heat-sink, and said outlet ports communicate with said second flow path from said heat-sink.

15. A system as defined in claim 14, in which a duct extends from said inlet port to communicate with the centrally located channel in said channel element.

16. A system cooling an integrated circuit chip comprising:
   a heat exchange element having a plurality of grooves extending across one side thereof and not extending through said element for conducting liquid coolant so as to remove heat from said integrated circuit chip, the other side of said heat exchange element being in intimate contact with the back side of said integrated circuit chip;
   coolant distribution means having at least one inlet port and one output port disposed on one side thereof, and at least one inlet and a plurality of output channel openings disposed on the other side thereof, said at least one inlet channel opening and said plurality of output channel openings being disposed over and accessing a portion of each of said grooves and forming a plurality of coolant flow paths along each of said grooves, said inlet and output ports being connected to said respective inlet channel opening and said plurality of output channel openings.

17. A system for cooling an integrated circuit according to claim 16 wherein said coolant distribution means includes an interconnection element and a channel element, said interconnection element including ducts which extend through said interconnection element and register at one end thereof with said at least one inlet and output ports, said channel element including distributor passages which extend through said channel element and on one side thereof intercept said ducts and on the other side thereof terminate and register with said inlet and output channel openings.

* * * * *